United States Patent
Kim et al.

(10) Patent No.: US 11,437,611 B2
(45) Date of Patent: Sep. 6, 2022

(54) NEGATIVE ELECTRODE ACTIVE MATERIAL, NEGATIVE ELECTRODE INCLUDING THE SAME, SECONDARY BATTERY INCLUDING THE NEGATIVE ELECTRODE, AND PREPARATION METHOD OF THE NEGATIVE ELECTRODE ACTIVE MATERIAL

(71) Applicant: LG CHEM, LTD., Seoul (KR)

(72) Inventors: Dong Hyuk Kim, Daejeon (KR); Eun Kyung Kim, Daejeon (KR); Yong Ju Lee, Daejeon (KR); Rae Hwan Jo, Daejeon (KR); Jung Hyun Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 139 days.

(21) Appl. No.: 16/606,090

(22) PCT Filed: Mar. 27, 2018

(86) PCT No.: PCT/KR2018/003627
§ 371 (c)(1),
(2) Date: Oct. 17, 2019

(87) PCT Pub. No.: WO2018/203599
PCT Pub. Date: Nov. 8, 2018

(65) Prior Publication Data
US 2021/0151742 A1 May 20, 2021

(30) Foreign Application Priority Data

May 4, 2017 (KR) .................. 10-2017-0057049

(51) Int. Cl.
*H01M 4/13* (2010.01)
*H01M 4/134* (2010.01)
(Continued)

(52) U.S. Cl.
CPC ......... *H01M 4/134* (2013.01); *H01M 4/0428* (2013.01); *H01M 4/0471* (2013.01);
(Continued)

(58) Field of Classification Search
CPC .. H01M 4/134; H01M 4/0428; H01M 4/0471; H01M 4/131; H01M 4/133;
(Continued)

(56) References Cited

U.S. PATENT DOCUMENTS 7,691,441 B2 4/2010 Park et al.
10,593,933 B2 3/2020 Oh et al.
(Continued)

FOREIGN PATENT DOCUMENTS

CN 1830105 A 9/2006
CN 1990909 A 7/2007
(Continued)

OTHER PUBLICATIONS

Jain et al., "Carbon nanowalls deposited by inductively coupled plasma enhanced chemical vapor deposition using aluminum acetylacetonate as precursor" Carbon. vol. 49, Iss. 15. Jul. 23, 2011, p. 4987-4995 (Year: 2011).*

(Continued)

*Primary Examiner* — William E McClain
*Assistant Examiner* — Kirsten B Tysl
(74) *Attorney, Agent, or Firm* — Birch, Stewart, Kolasch & Birch, LLP

(57) ABSTRACT

A negative electrode active material and a method for preparing a negative electrode active material, comprising preparing a silicon-based compound including $SiO_x$, wherein $0.5<x<1.3$, and forming a crystalline carbon coating layer on the silicon-based compound through a chemical vapor deposition method using an organometallic compound as a source, wherein the organometallic compound is at least (Continued)

any one selected from the group consisting of aluminum acetylacetonate, aluminum ethoxide, aluminum phenoxide, aluminum acetate, aluminum tributoxide, and a combination thereof.

14 Claims, 1 Drawing Sheet

(51) Int. Cl.
| | | |
|---|---|---|
| H01M 4/04 | (2006.01) | |
| H01M 4/131 | (2010.01) | |
| H01M 4/133 | (2010.01) | |
| H01M 4/1391 | (2010.01) | |
| H01M 4/1393 | (2010.01) | |
| H01M 4/1395 | (2010.01) | |
| H01M 4/36 | (2006.01) | |
| H01M 4/38 | (2006.01) | |
| H01M 4/58 | (2010.01) | |
| H01M 10/0525 | (2010.01) | |
| H01M 4/02 | (2006.01) | |

(52) U.S. Cl.
CPC ........... *H01M 4/131* (2013.01); *H01M 4/133* (2013.01); *H01M 4/1391* (2013.01); *H01M 4/1393* (2013.01); *H01M 4/1395* (2013.01); *H01M 4/366* (2013.01); *H01M 4/386* (2013.01); *H01M 4/58* (2013.01); *H01M 10/0525* (2013.01); *H01M 2004/027* (2013.01)

(58) Field of Classification Search
CPC ............. H01M 4/1391; H01M 4/1393; H01M 4/1395; H01M 4/366; H01M 4/386; H01M 4/58; H01M 10/0525; H01M 2004/027

See application file for complete search history.

(56) References Cited

U.S. PATENT DOCUMENTS

| | | | |
|---|---|---|---|
| 2005/0186475 A1 | 8/2005 | Jeong et al. | |
| 2007/0148451 A1 | 6/2007 | Park et al. | |
| 2007/0190413 A1 | 8/2007 | Lee et al. | |
| 2012/0003545 A1 | 1/2012 | Lee et al. | |
| 2012/0244292 A1 | 9/2012 | Lee et al. | |
| 2012/0258371 A1 | 10/2012 | Nakanishi et al. | |
| 2013/0309578 A1 | 11/2013 | Umeno et al. | |
| 2014/0087268 A1 | 3/2014 | Kim et al. | |
| 2014/0170485 A1 | 6/2014 | Lee et al. | |
| 2014/0234535 A1 | 8/2014 | Lee et al. | |
| 2014/0322606 A1 | 10/2014 | Lee et al. | |
| 2014/0322611 A1 | 10/2014 | Lee et al. | |
| 2014/0363741 A1 | 12/2014 | Lee et al. | |
| 2014/0377653 A1 | 12/2014 | Park et al. | |
| 2015/0194669 A1 | 7/2015 | Inoue et al. | |
| 2016/0043390 A1 | 2/2016 | Shin et al. | |
| 2016/0190589 A1 | 6/2016 | Oono et al. | |
| 2017/0081248 A1 | 3/2017 | Jeong et al. | |
| 2017/0117542 A1 | 4/2017 | Park et al. | |
| 2017/0117543 A1 | 4/2017 | Park et al. | |
| 2017/0141383 A1* | 5/2017 | Dadheech | H01M 4/0426 |
| 2018/0040886 A1 | 2/2018 | Yokoi et al. | |
| 2018/0090750 A1 | 3/2018 | Oh et al. | |

FOREIGN PATENT DOCUMENTS

| | | | | |
|---|---|---|---|---|
| CN | 104247105 A | | 12/2014 | |
| CN | 106544640 A | | 3/2017 | |
| EP | 2372816 A1 | * | 10/2011 | ............ H01M 4/134 |
| EP | 3136477 A1 | | 3/2017 | |
| JP | 2001-6676 A | | 1/2001 | |
| JP | 2012-33317 A | | 2/2012 | |
| JP | 2012-221758 A | | 11/2012 | |
| JP | 2013-258032 A | | 12/2013 | |
| JP | 2014-532267 A | | 12/2014 | |
| JP | 2015-65173 A | | 4/2015 | |
| JP | 2015-512130 A | | 4/2015 | |
| JP | 2015-525453 A | | 9/2015 | |
| JP | 2015-536556 A | | 12/2015 | |
| JP | 2016-126875 A | | 7/2016 | |
| KR | 10-2008-0111809 A | | 12/2008 | |
| KR | 10-1032214 B1 | | 5/2011 | |
| KR | 10-2013-0142148 A | | 12/2013 | |
| KR | 10-2014-0073426 A | | 6/2014 | |
| KR | 10-1476043 B1 | | 12/2014 | |
| KR | 10-1586816 B1 | | 1/2016 | |
| KR | 10-2016-0018267 A | | 2/2016 | |
| WO | WO 2014/088270 A1 | | 6/2014 | |
| WO | WO 2016/136178 A1 | | 9/2016 | |

OTHER PUBLICATIONS

Extended European Search Report for European Application No. 18794327.9, dated Apr. 7, 2020.

International Search Report (PCT/ISA/210) issued in PCT/KR2018/003627, dated Jul. 6, 2018.

Indian Office Action dated Apr. 19, 2021 in corresponding IN Application No. 201917044655.

* cited by examiner

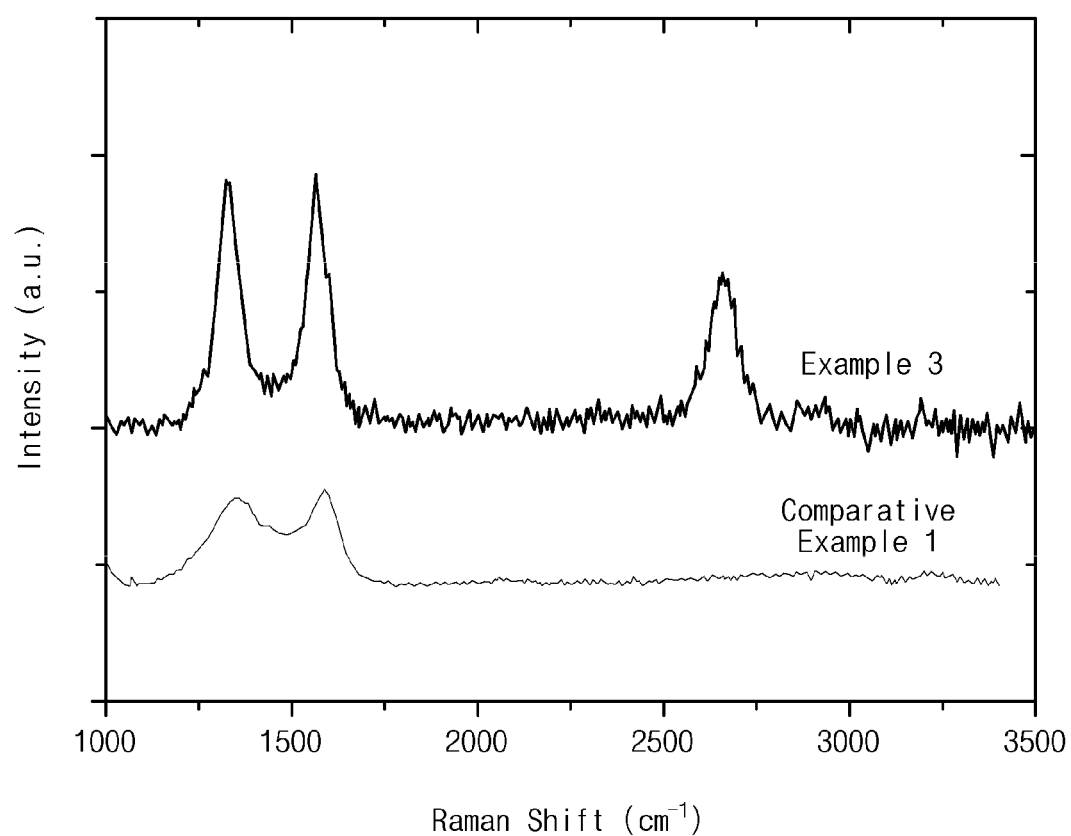

NEGATIVE ELECTRODE ACTIVE MATERIAL, NEGATIVE ELECTRODE INCLUDING THE SAME, SECONDARY BATTERY INCLUDING THE NEGATIVE ELECTRODE, AND PREPARATION METHOD OF THE NEGATIVE ELECTRODE ACTIVE MATERIAL

CROSS-REFERENCE TO RELATED APPLICATIONS

This application claims the benefit of Korean Patent Application No. 10-2017-0057049, filed on May 4, 2017, in the Korean Intellectual Property Office, the disclosure of which is incorporated herein in its entirety by reference.

TECHNICAL FIELD

The present invention relates to a negative electrode active material, a negative electrode including the same, a secondary battery including the negative electrode, and a preparation method of the negative electrode active material. Specifically, the negative electrode active material is characterized by including a silicon-based compound including $SiO_x$ ($0.5<x<1.3$) and a crystalline carbon coating layer disposed on the silicon-based compound, wherein the crystalline carbon coating layer is characterized by containing aluminum.

BACKGROUND ART

Demands for the use of alternative energy or clean energy are increasing due to the rapid increase in the use of fossil fuel, and as a part of this trend, the most actively studied field is a field of electricity generation and electricity storage using an electrochemical reaction.

Currently, a typical example of an electrochemical device using such electrochemical energy is a secondary battery and the usage areas thereof are increasing more and more. In recent years, as technology development of and demand for portable devices such as portable computers, mobile phones, and cameras have increased, demands for secondary batteries as an energy source have been significantly increased. Among such secondary batteries, lithium secondary batteries having high energy density, that is lithium secondary batteries having a high capacity, have been subjected to considerable research and also have been commercialized and widely used.

In general, a secondary battery is composed of a positive electrode, a negative electrode, an electrolyte, and a separator. The negative electrode includes a negative electrode active material for intercalating and de-intercalating lithium ions from the positive electrode, and as the negative electrode active material, a silicon-based active material having a high discharge capacity may be used. However, the silicon-based active material has a problem in that the initial efficiency thereof is low. In order to solve such problem, a method of reducing a portion of the silicon-based active material is used.

However, during the reduction process, a silicate-based by-product is generated, and the by-product is reacted with internal or external moisture of a manufactured secondary battery to generate gas, causing a problem of deteriorating the lifespan and stability of the secondary battery.

Therefore, a method of forming a carbon coating layer on the reduced silicon-based active material through a chemical vapor deposition method to prevent a reaction of moisture and the by-product, and at the same time, forming the carbon coating layer as a crystalline layer to improve the surface conductivity of the active material is used. However, in order to form a crystalline carbon coating layer on a particle through a chemical vapor deposition method, a metal catalyst should be first disposed on the particle. However, in this case, a step of disposing a metal catalyst and a step of removing the metal catalyst after a crystalline carbon coating layer is formed are required. Thus, the process becomes complicated.

Therefore, there is a demand for the development of a method for preparing a negative electrode active material, the method capable of simplifying a process by not using a separate metal catalyst in the process of forming a crystalline carbon coating layer on a silicon-based compound.

PRIOR ART DOCUMENT

Patent Document (Patent Document 1) Korean Patent Laid-Open Publication No. 10-2008-0111809

DISCLOSURE OF THE INVENTION

Technical Problem

An aspect of the present invention provides a method for preparing a negative electrode active material, the method capable of simplifying a process by not using a separate metal catalyst in the process of forming a crystalline carbon coating layer on a silicon-based compound.

Another aspect of the present invention provide a negative electrode active material capable of minimizing the generation of gas due to moisture, a negative electrode, and a secondary battery.

Technical Solution

According to an aspect of the present invention, there is provided a method for preparing a negative electrode active material including preparing a silicon-based compound including $SiO_x$ ($0.5<x<1.3$); and forming a crystalline carbon coating layer on the silicon-based compound through a chemical vapor deposition method using an organometallic compound as a source, wherein the organometallic compound is at least any one selected from the group consisting of aluminum acetylacetonate, aluminum ethoxide, aluminum phenoxide, aluminum acetate, aluminum tributoxide, and a combination thereof.

According to another aspect of the present invention, there are provided a negative electrode active material, a negative electrode including the negative electrode active material, and a secondary battery including the negative electrode, wherein the negative electrode active material includes a silicon-based compound including $SiO_x$ ($0.5<x<1.3$); and a crystalline carbon coating layer disposed on the silicon-based compound, and configured to contain aluminum.

Advantageous Effects

A method for preparing a negative electrode active material according to an embodiment of the present invention may form a crystalline carbon coating layer without using a separate metal catalyst by using an organometallic compound as a source of CVD when forming a crystalline carbon coating layer. Accordingly, a metal catalyst deposition process, a metal catalyst removal process, and the like may be omitted, thereby simplifying a process of preparing a negative electrode active material. In addition, a negative electrode active material according to another embodiment of the present invention is capable of minimizing the generation of gas due to a reaction of external moisture and a by-product in a silicon-based compound by including a crystalline carbon coating layer. Accordingly, the lifespan characteristic and stability of a secondary battery including the negative electrode active material may be improved.

BRIEF DESCRIPTION OF THE DRAWINGS

FIG. 1 shows a Raman spectrum of a carbon coating layer of a negative electrode active material of Example 3 of the present invention, and a Raman spectrum of a carbon coating layer of a negative electrode active material of Comparative Example 1 of the present invention.

MODE FOR CARRYING OUT THE INVENTION

Hereinafter, the present invention will be described in more detail to facilitate understanding of the present invention.

It will be understood that words or terms used in the specification and claims shall not be interpreted as the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

The terminology used herein is for the purpose of describing particular example embodiments only and is not intended to be limiting of the present invention. In the specification, the terms of a singular form may include plural forms unless referred to the contrary.

It will be further understood that the terms "include," "comprise," or "have" when used in this specification, specify the presence of stated features, numbers, steps, elements, or combinations thereof, but do not preclude the presence or addition of one or more other features, numbers, steps, elements, or combinations thereof.

A method for preparing a negative electrode active material according to an embodiment of the present invention may be a method for preparing a negative electrode active material including preparing a silicon-based compound including $SiO_x$, wherein $0.5<x<1.3$; and forming a crystalline carbon coating layer on the silicon-based compound through a chemical vapor deposition method using an organometallic compound as a source, wherein the organometallic compound is at least any one selected from the group consisting of aluminum acetylacetonate, aluminum ethoxide, aluminum phenoxide, aluminum acetate, aluminum tributoxide, and a combination thereof.

The silicon-based compound may include $SiO_x$ ($0.5<x<1.3$). The preparing of a silicon-based compound may include reacting $SiO_{x1}$, wherein $0<x1<2$ with metal. The $SiO_{x1}$ ($0<x1<2$) and $SiO_x$ ($0.5<x<1.3$) may be in a form which includes Si and $SiO_2$. That is, the x and x1 correspond to a number ratio of O to Si included in the $SiO_x$ ($0.5<x<1.3$) or $SiO_{x1}$ ($0<x1<2$), respectively.

The silicon-based compound may include a metal silicate. Specifically, the metal silicate may be doped into $SiO_x$ ($0.5<x<1.3$) through reacting the $SiO_{x1}$ ($0<x1<2$) with metal. The metal silicate may be located inside the silicon-based compound.

The reaction between the $SiO_{x1}$ ($0<x1<2$) and the metal may be performed by reacting $SiO_{x1}$ ($0<x1<2$) with metal powder or metal gas, wherein the metal powder or metal gas include the metal.

The metal may be at least any one selected from the group consisting of Li, Mg, Ti, Ca, and a combination thereof, and may be specifically Li and Mg. The reaction may be performed for 1 hour to 24 hours at a temperature of 300° C. to 1000° C.

The reaction may be performed while inert gas is flowing. The inert gas may be at least any one selected from the group consisting of Ar, $N_2$, Ne, He, Kr, and a combination thereof.

The preparing of a silicon-based compound may further include removing a portion of the metal silicate generated during the reaction process with metal.

Specifically, the preparing of a silicon-based compound may include removing a metal silicate disposed on a surface of the silicon-based compound among the metal silicate generated during the reaction process with metal.

The metal silicate may be removed using an HCl aqueous solution.

In the forming of a crystalline carbon coating layer, the chemical vapor deposition method may include vaporizing the organometallic compound, and introducing the vaporized organometallic compound into a chamber in which the silicon-based compound is disposed.

The organometallic compound may be at least any one selected from the group consisting of aluminum acetylacetonate, aluminum ethoxide, aluminum phenoxide, aluminum acetate, aluminum tributoxide, and a combination thereof.

In general, in order to form a crystalline carbon coating layer on a particle through a chemical vapor deposition method, a metal catalyst should be first disposed on the particle. However, in this case, a step of disposing a metal catalyst and a step of removing the metal catalyst after a crystalline carbon coating layer is formed are required. Thus, the process becomes complicated. On the other hand, when forming a crystalline carbon coating layer according to an embodiment of the present invention, in the case of using an organometallic compound as a source of CVD, it is possible to form the crystalline carbon coating layer without using a separate metal catalyst. Specifically, the metal component of the organometallic compound may act as a catalyst, and the carbon component of the organometallic compound may act as a carbon source. Accordingly, a metal catalyst deposition step and a metal catalyst removal step may be omitted. Thus, it is possible to simplify the process.

An introduction rate of the organometallic compound may be 1 SCCM to 50 SCCM, specifically 5 SCCM to 20 SCCM. When the introduction rate is satisfied, a carbon coating layer which is uniform and highly crystalline may be formed.

The temperature inside the chamber is 300° C. to 1000° C., and may be specifically 400° C. to 900° C. In addition, the chemical vapor deposition method may be performed for 0.5 minutes to 1 hour, specifically 2 minutes to 5 minutes. When the temperature and time ranges are satisfied, a carbon coating layer which is uniform and highly crystalline may be formed while the growth of silicon grains is inhibited.

A negative electrode active material according to another embodiment of the present invention may include a silicon-based compound including $SiO_x$, wherein $0.5<x<1.3$; and a crystalline carbon coating layer disposed on the silicon-based compound, wherein the crystalline carbon coating layer may contain aluminum.

The average particle diameter ($D_{50}$) of the silicon-based compound may be 0.1 µm to 20 µm. Specifically 0.5 µm to 10 µm. When the average particle diameter of the silicon-based compound satisfied the above described range, the rate characteristic of a battery may be improved.

The silicon-based compound may further include a metal silicate. Specifically, the metal silicate may be in a doped state in the $SiO_x$ (0.5<x<1.3). The metal silicate may include at least any one selected from the group consisting of $Li_2Si_2O_5$, $Li_3SiO_3$, $Li_4SiO_4$, $Mg_2SiO_4$, $MgSiO_3$, $Ca_2SiO_4$, $CaSiO_3$, $TiSiO_4$, and a combination thereof.

Metal of the metal silicate may be included in an amount of 1 part by weight to 30 parts by weight, specifically 2 parts by weight to 20 parts by weight based on 100 parts by weight of the $SiO_x$ (0.5<x<1.3). When the above described range is satisfied, the growth of silicon grains may be inhibited and initial efficiency may be improved.

The crystalline carbon coating layer may include crystalline carbon. The D/G ratio of Raman spectrum of the crystalline carbon coating layer may be greater than 0 to less than 1, specifically 0.1 to 0.9. Furthermore, the 2D/G ratio of Raman spectrum of the crystalline carbon coating layer may be greater than 0 to less than 1, specifically 0.1 to 0.9. Here, the D/G ratio is a ratio of D-band peak to G-band peak in Raman spectrum, and the 2D/G ratio is a ratio of 2D-band peak to G-band peak in Raman spectrum. The D-band peak, the G-band peak, and the 2D-band peak correspond to a peak located at 1350 $cm^{-1}$, 1590 $cm^{-1}$, 2700 $cm^{-1}$ on the Raman spectrum, respectively. The satisfaction of the above described ratios means that a crystalline carbon coating layer is formed.

The thickness of the crystalline carbon coating layer may be 0.01 µm to 1 µm, specifically 0.1 µm to 0.9 µm. When the thickness of the crystalline carbon coating layer satisfies the above described range, it is possible to minimize the generation of gas due to the reaction of external moisture and a by-product in a silicon-based compound without decreasing initial efficiency.

The crystalline carbon coating layer may include aluminum. The aluminum may be derived from the organometallic compound used as a source of chemical vapor deposition in the method for manufacturing a negative electrode active material. The aluminum may be included in an amount of 0.1 part by weight to 10 parts by weight, specifically 0.5 parts by weight to 5 parts by weight based on 100 parts by weight of the crystalline carbon coating layer. When the aluminum satisfies the above described range, it means that an appropriate amount of organometallic compound is used as a source of CVD. Thus, a reaction of moisture and a by-product of a silicon-based compound may be prevented and initial efficiency and rate characteristic may be maintained.

A negative electrode according to another embodiment of the present invention may include a negative electrode active material. Here, the negative electrode active material is the same as the negative electrode active material described above. Specifically, the negative electrode may include a current collector, and a negative electrode active material layer disposed on the current collector. The negative electrode active material layer may include the negative electrode active material. Furthermore, the negative electrode active material may further include a binder and/or a conductive agent. In addition, the negative electrode may further include a graphite-based particle, and the graphite-based particle may include in the negative electrode active material layer.

The binder may include at least any one selected from the group consisting of a polyvinylidene fluoride-hexafluoropropylene copolymer (PVDF-co-HFP), polyvinylidenefluoride (PVDF), polyacrylonitrile, polymethylmethacrylate, polyvinyl alcohol, carboxymethyl cellulose (CMC), starch, hydroxypropyl cellulose, regenerated cellulose, polyvinylpyrrolidone, tetrafluoroethylene, polyethylene, polypropylene, polyacrylic acid, an ethylene-propylene-diene monomer (EPDM), a sulfonated EPDM, styrene-butadiene rubber (SBR), fluorine rubber, materials having the hydrogen thereof substituted with Li, Na, or Ca, and the like, and a combination thereof. In addition, the binder may include various copolymers thereof.

The conductive agent is not particularly limited as long as it has conductivity without causing a chemical change in the battery. For example, as the conductive agent, graphite such as natural graphite or artificial graphite; a carbonaceous material such as carbon black, acetylene black, Ketjen black, channel black, furnace black, lamp black, and thermal black; conductive fiber such as carbon fiber or metal fiber; a conductive tube such as a carbon nanotube; metal powder such as fluorocarbon powder, aluminum powder, and nickel powder; a conductive whisker such as zinc oxide and potassium titanate; a conductive metal oxide such as titanium oxide; a conductive material such as a polyphenylene derivative may be used.

The graphite-based active material particle may be one or more selected from the group consisting of artificial graphite, natural graphite, graphitized carbon fiber, and graphitized mesocarbon microbeads. By using the graphite-based active material particle with a secondary particle, it is possible to improve the charge/discharge characteristic of a battery.

A secondary battery according to another embodiment of the present invention may include a negative electrode, a positive electrode, a separator disposed between the positive electrode and the negative electrode, and an electrolyte. The negative electrode is the same as the negative electrode described above. Since the negative electrode has been described above, the detailed description thereof will be omitted.

The positive electrode may include a positive electrode active material. The positive electrode active material may be a positive electrode active material commonly used in the art. Specifically, the positive electrode active material may be a layered compound such as lithium cobalt oxide ($LiCoO_2$) and lithium nickel oxide ($LiNiO_2$), or a compound substituted with one or more transition metals; a lithium manganese oxide such as $Li_{1+y1}Mn_{2-y1}O_4$ (0≤y1≤0.33), $LiMnO_3$, $LiMn_2O_3$, and $LiMnO_2$; lithium copper oxide ($Li_2CuO_2$); a vanadium oxide such as $LiV_3O_8$, $V_2O_5$, and $Cu_2V_2O_7$; a Ni-site type lithium nickel oxide represented by the formula $LiNi_{1-y2}M_{y2}O_2$ (wherein M is any one of Co, Mn, Al, Cu, Fe, Mg, B or Ga, and 0.01≤y2≤0.3); a lithium manganese composite oxide represented by the formula $LiMn_{2-y3}M_{y3}O_2$ (wherein, M is any one of Co, Ni, Fe, Cr, Zn, or Ta, and 0.01≤y3≤0.1), or by the formula $Li_2Mn_3MO_8$ (wherein, M is any one of Fe, Co, Ni, Cu, or Zn); $LiMn_2O_4$ having a part of Li in the formula substituted with an alkaline earth metal ion, and the like, but is not limited thereto. The positive electrode may be a Li-metal.

The separator is to separate the negative electrode and the positive electrode and to provide a movement path for lithium ions. Any separator may be used without particular limitation as long as it is typically used as a separator in a secondary battery. Particularly, a separator having excellent moisture-retention of an electrolyte as well as low resistance to ion movement in the electrolyte is preferable. Specifically, a porous polymer film, for example, a porous polymer film manufactured using a polyolefin-based polymer such as an ethylene homopolymer, a propylene homopolymer, an ethylene/butene copolymer, an ethylene/hexene copolymer, and an ethylene/methacrylate copolymer, or a laminated structure having two or more layers thereof may be used. Also, a typical porous non-woven fabric, for example, a non-woven fabric formed of glass fiber having a high melting point, or polyethylene terephthalate fiber, and the like may be used as the separator. Also, a coated separator including a ceramic component or a polymer material may be used to secure heat resistance or mechanical strength, and may be selectively used having a single layered or a multilayered structure.

The electrolyte may be an organic liquid electrolyte, an inorganic liquid electrolyte, a solid polymer electrolyte, a gel-type polymer electrolyte, a solid inorganic electrolyte, a molten-type inorganic electrolyte, and the like, which may be used in the manufacturing of a lithium secondary battery, but is not limited thereto.

Specifically, the electrolyte may include a non-aqueous organic solvent and a lithium salt.

As the non-aqueous organic solvent, for example, an aprotic organic solvent, such as N-methyl-2-pyrrolidone, propylene carbonate, ethylene carbonate, butylene carbonate, dimethyl carbonate, diethyl carbonate, γ-butyrolactone, 1,2-dimethoxy ethane, tetrahydroxy franc, 2-methyl tetrahydrofuran, dimethyl sulfoxide, 1,3-dioxolane, formamide, diemthylformamide, dioxolane, acetonitrile, nitromethane, methyl formate, methyl acetate, phosphate triester, trimethoxy methane, a dioxolane derivative, sulfolane, methyl sulfolane, 1,3-dimethyl-2-imidazolidinone, a propylene carbonate derivative, a tetrahydrofuran derivative, ether, methyl propionate, and ethyl propionate may be used.

In particular, among the carbonate-based organic solvents, cyclic carbonates ethylene carbonate and propylene carbonate may be preferably used since they are organic solvents of a high viscosity having high permittivity to dissociate a lithium salt well. Furthermore, such a cyclic carbonate may be more preferably used since the cyclic carbonate may be mixed with a linear carbonate of a low viscosity and low permittivity such as dimethyl carbonate and diethyl carbonate in an appropriate ratio to prepare an electrolyte having a high electric conductivity.

As the metal salt, a lithium salt may be used. The lithium salt is a material which is easily dissolved in the non-aqueous electrolyte. For example, as an anion of the lithium salt, one or more selected from the group consisting of $F^-$, $Cl^-$, $I^-$, $NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$ 및 $(CF_3CF_2SO_2)_2N^-$ may be used.

In order to improve the lifespan properties of a battery, suppress the decrease in battery capacity, and improve the discharge capacity of the battery, one or more additives, for example, a halo-alkylene carbonate-based compound such as difluoroethylene carbonate, pyridine, triethylphosphite, triethanolamine, cyclic ether, ethylenediamine, n-glyme, hexaphosphoric triamide, a nitrobenzene derivative, sulfur, a quinone imine dye, N-substituted oxazolidinone, N,N-substituted imidazolidine, ethylene glycol dialkyl ether, an ammonium salt, pyrrole, 2-methoxy ethanol, or aluminum trichloride, and the like may be further included in the electrolyte other than the above electrolyte components.

According to another embodiment of the present invention, a battery module including the secondary battery as a unit cell, and a battery pack including the same are provided. The battery module and the battery pack include the secondary battery which has a high capacity, a high rate capability and a cycle characteristic, and thus, may be used as a power source of a medium-and-large sized device selected from the group consisting of an electric car, a hybrid electric vehicle, a plug-in hybrid electric vehicle, and a power storage system.

Hereinafter, preferred embodiments of the present invention will be described in detail to facilitate understanding of the present invention. However, the embodiments are merely illustrative of the present invention, and thus, it will be apparent to those skilled in the art that various modifications and variations can be made without departing from the scope and spirit of the present invention as disclosed in the accompanying claims. It is obvious that such variations and modifications fall within the scope of the appended claims.

EXAMPLES AND COMPARATIVE EXAMPLES

Preparation Example 1: Preparation of a Silicon-Based Compound 20 g of SiO powder and 2 g of metal lithium powder were mixed and the mixture was stored in a reaction vessel of a chamber. Then, the temperature of the chamber was raised to 800° C. At this time, Ar was used as inert gas. After 2 hours of heat treatment, the temperature of the chamber was lowered to room temperature to collect a product in the reaction vessel. The collected product was acid-treated with HCl. Thereafter, the acid-treated product was milled to have an average particle diameter ($D_{50}$) of 5 μm to prepare a silicon-based compound. When measured using XRD, it was confirmed that the silicon-based compound contained $Li_2SiO_3$ and $Li_2Si_2O_3$, which are metal silicates, and that lithium was contained in a total amount of 5 parts by weight based on 100 parts by weight of the silicon-based compound.

Example 1: Preparation of a Negative Electrode Active Material

The silicon-based compound of Preparation Example 1 was disposed in a chamber and then a chemical vapor deposition method was performed using aluminum acetylacetonate as a source. At this time, the temperature inside the chamber was 450° C. and the chemical vapor deposition method was performed at 10 SCCM, $10^{-1}$ torr for 0.5 minutes. Thereby, a crystalline carbon layer was formed on the silicon-based compound to prepare a negative electrode active material.

Example 2: Preparation of a Negative Electrode Active Material

The silicon-based compound of Preparation Example 1 was disposed in a chamber and then a chemical vapor deposition method was performed using aluniiniini acetylacetonate as a source. At this time, the temperature inside the chamber was 450° C. and the chemical vapor deposition method was performed at 10 SCCM, $10^{-1}$ torr for 10 minutes. Thereby, a crystalline carbon layer was formed on the silicon-based compound to prepare a negative electrode active material.

Example 3: Preparation of a Negative Electrode Active Material

The silicon-based compound of Preparation Example 1 was disposed in a chamber and then a chemical vapor deposition method was performed using aluminum acetylacetonate as a source. At this time, the temperature inside the chamber was 450° C. and the chemical vapor deposition method was perfomied at 10 SCCM, $10^{-1}$ torr for 5 minutes. Thereby, a crystalline carbon layer was formed on the silicon-based compound to prepare a negative electrode active material.

Comparative Example 1: Preparation of a Negative Electrode Active Material

The silicon-based compound of Preparation Example 1 was disposed in a chamber and then a chemical vapor deposition method was performed using methane as a source. At this time, the temperature inside the chamber was 900° C. and the chemical vapor deposition method was performed at $10^{-1}$ torr for 20 minutes. Thereby, a crystalline carbon layer was formed on the silicon-based compound to prepare a negative electrode active material.

The aluminum content of the negative electrode active materials of Examples 1 to 3 and Comparative Example 1 prepared above is shown in Table 1.

TABLE 1

|  | Aluminum content (Parts by weight based on 100 parts by weight of the crystalline carbon coating layer) |
|---|---|
| Example 1 | 0.5 |
| Example 2 | 15 |
| Example 3 | 3 |
| Comparative Example 1 | 0 |

The aluminum content was confirmed using inductively coupled plasma mass spectrometry (ICP) on the prepared negative electrode active materials.

Example 4 to 6 and Comparative Example 2: Preparation of a Negative Electrode Slurry Using each of the negative electrode active materials of Examples 1 to 3 and Comparative Example 1, negative electrode slurry of Examples 4 to 6 and Comparative Example 2 was prepared. Specifically, each of the negative electrode active materials of Examples 1 to 3 and Comparative Example 1, natural graphite, carbon black having an average particle diameter ($D_{50}$) of 65 nm, CMC, and styrene butadiene rubber (SBR) were added to and mixed with distilled water as a solvent in a weight ratio of 9.6:86.2:1.0:1.7:1.5 to prepare negative electrode slurry having a mixture solid content of 45%.

Experimental Example 1: Evaluation of Moisture Stability

For each of the negative electrode slurry of Examples to 6 and Comparative Example 2, moisture stability was evaluated in the following manner and is shown in Table 2. Each of the negative electrode slurry of Examples 4 to 6 and Comparative Example 2 was introduced into a closed cell, and then the time of gas generation was measured using a pressure gauge connected to the closed cell.

TABLE 2

|  | Example 4 | Example 5 | Example 6 | Comparative Example 2 |
|---|---|---|---|---|
| Moisture stability (Time of gas generation, time) | 24 | 150 (Measured up to 150 hours but no gas was generated) | 150 (Measured up to 150 hours but no gas was generated) | 0 (Gas was generated immediately) |

According to the above table, in the cases of the negative electrode slurry of Examples 4 to 6, since the negative electrode active material contained in the negative electrode slurry is effectively covered by a crystalline carbon coating layer, it can be seen that a reaction of moisture and a metal silicate inside the cell is effectively suppressed. On the contrary, in the case of the negative electrode slurry of Comparative Example 2, it can be seen that an amorphous carbon coating layer does not effectively prevent a reaction of moisture and a metal silicate inside the cell. That is, according to the preparation method of the present invention, a crystalline carbon coating layer may be effectively generated, and the effect thereof is excellent when compared with Comparative Example 2.

Example 7 to 9 and Comparative Example 3: Manufacturing of a Battery

Each of the negative electrode slurry of Examples 4 to 6 and Comparative Example 2 was applied on a copper (Cu) metal thin film which is a negative electrode current collector having a thickness of 20 μm by loading at 160 mg/25 cm² and then dried. At this time, the temperature of circulating air was 60° C. Subsequently, the negative electrode current collector on which the slurry was coated and dried was roll pressed, and then dried in a vacuum oven of 130° C. for 12 hours to manufacture a negative electrode.

The negative electrode was cut into a circular shape of 1.4875 cm² to be used as a negative electrode, and Li-metal was used as a positive electrode. Between the positive electrode and the negative electrode, a separator of porous polyethylene was disposed, and an electrolyte in which $LiPF_6$ having a concentration of 1 M was dissolved was introduced to a mixed solution of fluoroethylene carbonate (FEC) and diethylene carbonate (DEC) in a mixing volume of 3:7 to manufacture a coin-half-cell including one Li-metal and one negative electrode.

Experimental Example 2: Evaluation of Capacity Retention

For each of the secondary batteries of Examples 7 to 9 and Comparative Example 3, capacity retention ratio was evaluated in the following manner and is shown in Table 3.

The first cycle was performed by charging at 0.1 C and discharging at 0.1 C, and from the second cycle to the 50$^{th}$ cycle, charging was performed at 0.5 C and discharging was performed at 0.5 C.

Charging condition: CC (constant current)/CV (constant voltage)(5 mV/0.005C currentcut-off)

Discharging condition: CC (constant current) Condition 1.0V

Capacity retention was derived by the following calculation, respectively.

Capacity retention (%)=(discharge capacity of 50 times/1.0 V discharge capacity of 1 time)×100

TABLE 3

|  | Example 7 | Example 8 | Example 9 | Comparative Example 3 |
|---|---|---|---|---|
| Capacity retention | 80.5 | 83.4 | 90 | 77 |

In the cases of the batteries of Examples 7 to 9, since the negative electrode active material is effectively covered by a crystalline carbon coating layer, it can be seen that a reaction of moisture and a metal silicate inside the cell is effectively suppressed. On the contrary, in the case of the battery of Comparative Example 3, it can be seen that an amorphous carbon coating layer does not effectively prevent a reaction of moisture and a metal silicate inside the cell. That is, according to the preparation method of the present invention, a crystalline carbon coating layer may be effectively generated, thereby improving capacity retention, and the effect thereof is excellent when compared with Comparative Example 3.

In addition, in the case of the battery of Example 9 in which a negative electrode active material containing aluminum in an amount of 3 wt % based on 100 parts by weight of the crystalline carbon coating layer was used, the capacity retention thereof was higher than that of the batteries of Examples 7 and 8 in which aluminum in an amount of 0.5 wt % and 15 wt %, respectively. It is believed that this was possible because a crystalline carbon coating layer which is uniform and highly crystalline was formed.

The invention claimed is:

1. A method for preparing a negative electrode active material, comprising:
preparing a silicon-based compound comprising $SiO_x$, wherein $0.5<x<1.3$; and
forming a crystalline carbon coating layer on the silicon-based compound through a chemical vapor deposition method using an organometallic compound as a source, wherein
the organometallic compound is at least any one selected from the group consisting of aluminum acetylacetonate, aluminum ethoxide, aluminum phenoxide, aluminum acetate, aluminum tributoxide, and a combination thereof, and
wherein aluminum is present in the crystalline carbon coating layer in an amount of 3 parts by weight to 10 parts by weight based upon 100 parts by weight of the crystalline carbon coating layer.

2. The method of claim 1, wherein
the preparing of the silicon-based compound is performed by reacting $SiO_{x1}$, wherein $0<x1<2$, with metallic powder or metallic gas, said metallic powder and metallic gas comprising metal.

3. The method of claim 2, wherein
the metal is at least any one selected from the group consisting of Li, Mg, Ti, Ca, and a combination thereof.

4. The method of claim 1, wherein
the chemical vapor deposition method comprises:
vaporizing the organometallic compound, and
introducing the vaporized organometallic compound into a chamber in which the silicon-based compound is disposed,
wherein an introduction rate of the organometallic compound into the chamber is 1 SCCM to 50 SCCM.

5. The method of claim 4, wherein
a temperature inside the chamber is 300° C. to 1000° C., and the chemical vapor deposition method is performed for 0.5 minutes to 1 hour.

6. A negative electrode active material comprising:
a silicon-based compound comprising $SiO_x$, wherein $0.5<x<1.3$; and
a crystalline carbon coating layer disposed on the silicon-based compound,
wherein said crystalline carbon coating layer comprises aluminum, wherein aluminum is present in the crystalline carbon coating layer in an amount of 3 parts by weight to 10 parts by weight based upon 100 parts by weight of the crystalline carbon coating layer.

7. The negative electrode active material of claim 6, wherein
the silicon-based compound further comprises a metal silicate, and
the metal silicate comprises at least any one selected from the group consisting of $Li_2Si_2O_5$, $Li_3SiO_3$, $Li_4SiO_4$, $Mg_2SiO_4$, $MgSiO_3$, $Ca_2SiO_4$, $CaSiO_3$, $TiSiO_4$, and a combination thereof.

8. The negative electrode active material of claim 7, wherein
metal of the metal silicate is included in an amount of 1 part by weight to 30 parts by weight based on 100 parts by weight of the $SiO_x$ ($0.5<x<1.3$).

9. The negative electrode active material of claim 6, wherein
a D/G ratio of Raman spectrum of the crystalline carbon coating layer is greater than 0 to less than 1, and a 2D/G ratio of Raman spectrum of the crystalline carbon coating layer is greater than 0 to less than 1.

10. The negative electrode active material of claim 6, wherein a thickness of the crystalline carbon coating layer is 0.01 μm to 1 μm.

11. The negative electrode active material of claim 6, wherein an average particle diameter ($D_{50}$) of the silicon-based compound is 0.5 μm to 10 μm.

12. A negative electrode comprising the negative electrode active material of claim 6.

13. The negative electrode of claim 12 further comprising a graphite-based particle.

14. A secondary battery comprising:
the negative electrode of claim 13;
a positive electrode;
a separator disposed between the positive electrode and the negative electrode; and
an electrolyte.

* * * * *